United States Patent
Ramachandran et al.

(10) Patent No.: US 11,243,235 B2
(45) Date of Patent: Feb. 8, 2022

(54) LOAD CURRENT SENSING AT LOW OUTPUT VOLTAGE

(71) Applicant: TEXAS INSTRUMENTS INCORPORATED, Dallas, TX (US)

(72) Inventors: Bhaskar Ramachandran, Coimbatore (IN); Kushal D. Murthy, Bangalore (IN); Aalok Dyuti Saha, New Town (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 347 days.

(21) Appl. No.: 16/230,564

(22) Filed: Dec. 21, 2018

(65) Prior Publication Data

US 2020/0011906 A1 Jan. 9, 2020

(30) Foreign Application Priority Data

Jul. 6, 2018 (IN) .............................. 201841025272

(51) Int. Cl.
*G01R 19/165* (2006.01)
*G01R 19/155* (2006.01)

(52) U.S. Cl.
CPC ..... *G01R 19/16519* (2013.01); *G01R 19/155* (2013.01)

(58) Field of Classification Search
None
See application file for complete search history.

(56) References Cited

U.S. PATENT DOCUMENTS

| 4,885,477 | A | * | 12/1989 | Bird | H03F 3/45076 |
| | | | | | 327/52 |
| 5,815,027 | A | * | 9/1998 | Tihanyi | G05F 3/24 |
| | | | | | 327/543 |
| 6,160,441 | A | * | 12/2000 | Stratakos | G01R 19/0092 |
| | | | | | 327/540 |
| 6,559,684 | B2 | * | 5/2003 | Goodfellow | G01R 19/16519 |
| | | | | | 327/53 |
| 6,775,165 | B2 | * | 8/2004 | Regev | G11C 7/062 |
| | | | | | 327/51 |
| 9,998,104 | B2 | * | 6/2018 | Matsuzaki | G11C 16/0425 |
| 10,862,443 | B2 | * | 12/2020 | Raimar | H03F 3/45179 |
| 2008/0297203 | A1 | * | 12/2008 | Niki | H03F 3/45273 |
| | | | | | 327/53 |

* cited by examiner

*Primary Examiner* — Lincoln D Donovan
*Assistant Examiner* — Khareem E Almo
(74) *Attorney, Agent, or Firm* — Valerie M. Davis; Charles A. Brill; Frank D. Cimino

(57) ABSTRACT

A device includes a first transistor coupled to an input voltage source and to an output voltage node and an amplifier comprising a first input, a second input, and an output. The device also includes a second transistor coupled to the input voltage source and the first input of the amplifier and a third transistor coupled to the second transistor and a ground node. The third transistor includes a control terminal coupled to the output of the amplifier. The device also includes a first voltage-controlled voltage source coupled to a control terminal of the first transistor and a control terminal of the second transistor and a second voltage-controlled voltage source coupled to the first transistor and the second input of the amplifier.

21 Claims, 5 Drawing Sheets

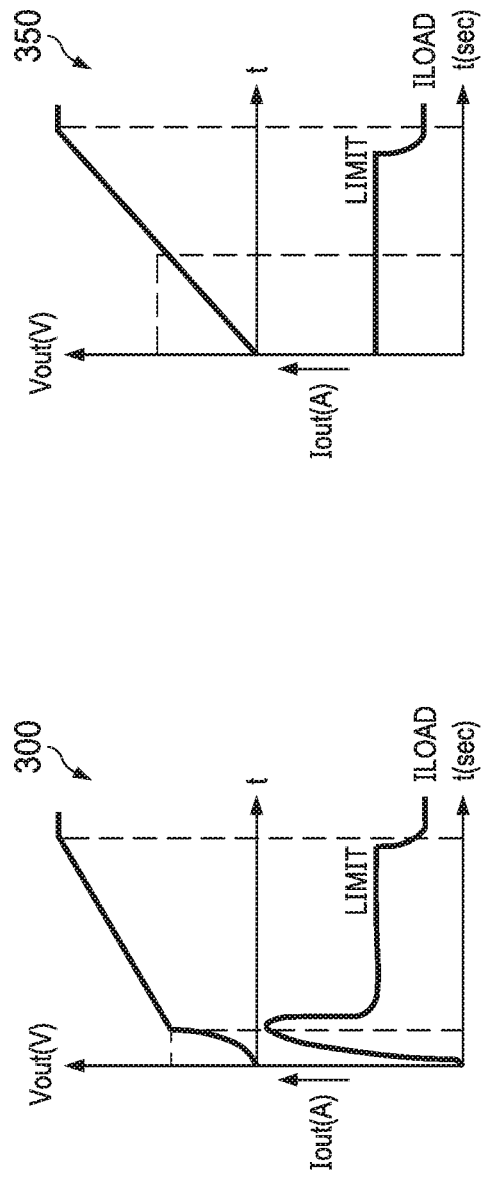
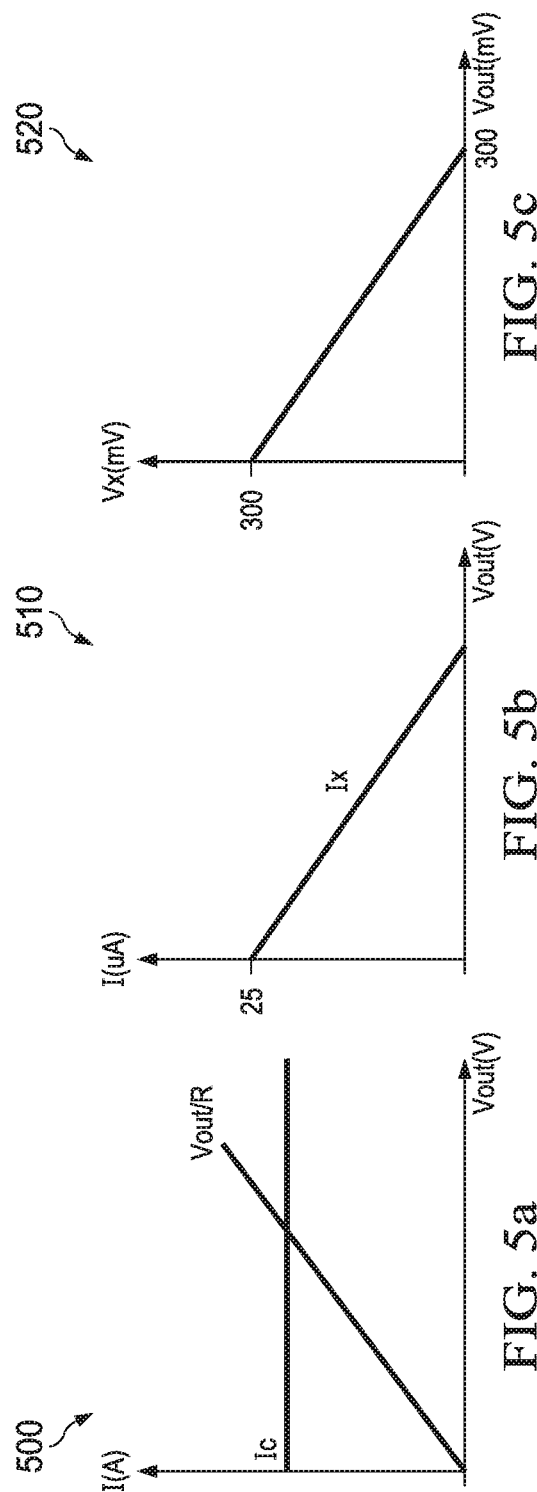

LOAD CURRENT SENSING AT LOW OUTPUT VOLTAGE

CROSS-REFERENCE TO RELATED APPLICATIONS

The present application claims priority to Indian Provisional Patent Application No. 201841025272, which was filed Jul. 6, 2018, is titled "ACCURATE CURRENT SENSING TECHNIQUE DOWN TO 0V VOUT FOR PRECISE CURRENT LIMIT AND MONITORING," and is hereby incorporated herein by reference in its entirety.

SUMMARY

In accordance with at least one example of the disclosure, a device includes a first transistor coupled to an input voltage source and to an output voltage node and an amplifier comprising a first input, a second input, and an output. The device also includes a second transistor coupled to the input voltage source and the first input of the amplifier and a third transistor coupled to the second transistor and a ground node. The third transistor includes a control terminal coupled to the output of the amplifier. The device also includes a first voltage-controlled voltage source coupled to a control terminal of the first transistor and a control terminal of the second transistor and a second voltage-controlled voltage source coupled to the first transistor and the second input of the amplifier.

In accordance with another example of the disclosure, a device includes a first transistor coupled to an input voltage source and to an output voltage node and configured to provide a load current to a load coupled to the output voltage node, a second transistor configured to generate a sense current proportional to the load current, and a third transistor coupled to the second transistor and a ground node. The third transistor comprises a control terminal. The device also includes an amplifier comprising a first input coupled to a node between the second and third transistors, a second input, and an output coupled to the control terminal of the third transistor. The device further includes a first voltage-controlled voltage source configured to bias a control terminal of the second transistor relative to a control terminal of the first transistor, and a second voltage-controlled voltage source configured to bias the second input of the amplifier relative to the output voltage node. The first and second voltage-controlled voltage sources are configured to be controlled in response to a voltage at the output voltage node.

In accordance with yet another example of the disclosure, a system includes a load coupled to an output voltage node and to a ground node and configured to draw a load current and a power switch and current sense circuit configured to supply the load current and to couple the output voltage node to an input voltage source. The power switch and current sense circuit includes a first transistor coupled to an input voltage source and to the output voltage node and an amplifier comprising a first input, a second input, and an output. The device also includes a second transistor coupled to the input voltage source and the first input of the amplifier and a third transistor coupled to the second transistor and a ground node. The third transistor includes a control terminal coupled to the output of the amplifier. The device also includes a first voltage-controlled voltage source coupled to a control terminal of the first transistor and a control terminal of the second transistor and a second voltage-controlled voltage source coupled to the first transistor and the second input of the amplifier.

BRIEF DESCRIPTION OF THE DRAWINGS

For a detailed description of various examples, reference will now be made to the accompanying drawings in which:

FIGS. 3a and 3b show waveforms demonstrating output voltage and load current behavior as a function of time in accordance with an example;

FIGS. 5a, 5b, and 5c show waveforms demonstrating the relationship between various voltages and currents as a function of output voltage in accordance with an example.

DETAILED DESCRIPTION

Figure 1:
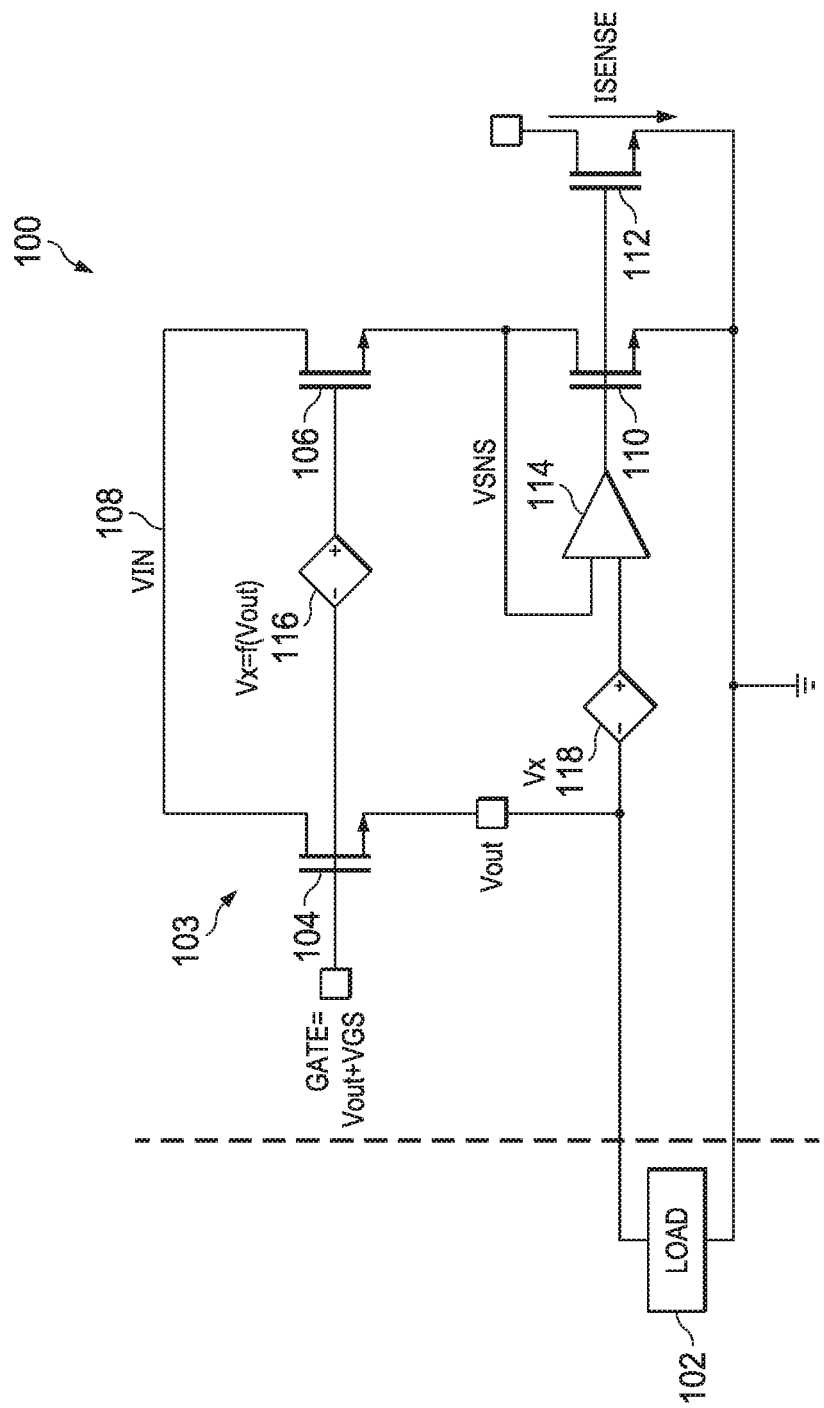
FIG. 1 shows a circuit schematic diagram for sensing a load current in accordance with an example.

A power switch for an electronic device couples an input voltage source to the electronic device, providing the electronic device with an output voltage (VOUT). The power switch is, for example, an n-type or p-type metal-oxide-semiconductor field effect transistor (MOSFET), and may be referred to generally as a "power FET." Power FETs are particularly useful for delivering power in high-voltage, high-current applications such as industrial applications (e.g., programmable logic controllers (PLCs), motors used for industrial automation and motors in robotic applications) and automotive applications (e.g., car infotainment systems). During normal operation, a gate driver applies a gate voltage to the gate of the power FET to turn the power FET on/off and to control the load current, or the current flowing into the electronic device. The load current should be regulated or limited to avoid damage to the electronic device.

In an example, a fuse is used to limit the load current thus protecting the electronic device. However, fuses are replaced over time, which can be both time consuming and costly. In order to regulate the load current such that it does not exceed a tolerable level for the electronic device, the load current may be sensed, which can then be used as feedback (e.g., as a feedback voltage) to regulate the gate voltage, and thus the load current.

Current sensing using a current-sense resistor, or resistive sensing, uses a shunt (series) resistor coupled to the power FET. The voltage across the resistor represents the magnitude of the load current. Resistive sensing is both accurate and generally easy to implement. However, particularly for high-current applications, resistive sensing results in unacceptable power consumption and/or heat generation characteristics. For high-current applications where resistive sensing consumes too much power and/or generates too much heat, a sense field effect transistor (or "sense FET") is used to sense the current flowing through the power FET. Schematically, the sense FET and power FET share common gate and drain connections, but separate source connections. The relative size of the sense FET and the power FET determines a current ratio between the two devices, and thus the current through the sense FET can be used to determine the current through the power FET. VOUT is equal to 0V or is close to 0V when the electronic device is powered on, or when a short develops in the electronic device. VOUT being equal to 0V or close to 0V results in a transistor coupled to the sense FET (through which current must flow to be sensed) having a low drain-to-source voltage ($V_{DS}$). However, due to the limitations imposed at low $V_{DS}$ of the transistor coupled to the sense FET, a sense FET-based solution may do a poor job of accurately sensing the load current when VOUT is equal to 0V or is close to 0V.

An example of the present disclosure that addresses the foregoing problems includes a device in which voltage-controlled voltage sources bias inputs to an amplifier, one of which is also coupled to a sense FET. Even when VOUT is equal to 0V, the voltage-controlled voltage source enables the $V_{DS}$ of the transistor coupled to the sense FET to be of a sufficient value to permit current to flow through the sense FET and the transistor coupled to the sense FET. As a result, the sense FET is able to accurately sense a load current even when VOUT is equal to 0V, and without the above-described drawbacks of resistive sensing. In some examples, the voltage-controlled voltage sources provide a voltage that decreases as VOUT increases, and eventually becomes 0V at a particular value of VOUT. For example, after VOUT is large enough that $V_{DS}$ limitations no longer impede current flow through the transistor coupled to the sense FET (e.g., $V_{DS}$ being too low to operate in saturation mode), the voltage provided by the voltage-controlled voltage source is 0V.

FIG. 1 shows a system 100 in accordance with examples of the disclosure. The system 100 includes an electronic device represented as a load 102, such as the electronic device described above, coupled to a power switch and current sense circuit 103 and to a ground node. The circuit 103 includes a transistor 104, which in this example is an n-type MOSFET and acts as a power FET. Specifically, a drain of the power FET 104 is coupled to an input voltage source 108 that provides an input voltage (VIN) and a source of the power FET 104 is coupled to the load 102. The power FET 104 also provides an output voltage (VOUT) to the load 102. A gate voltage of the power FET 104 regulates the amount of load current provided to the load 102.

The circuit 103 also includes a transistor 106, which in this example is an n-type MOSFET that acts as a sense FET. Specifically, a drain of the sense FET 106 is coupled to the input voltage source 108 and a source of the sense FET 106 is coupled to a first input of an amplifier 114. A gate of the sense FET 106 is coupled to a voltage-controlled voltage source 116, which biases the gate voltage of the sense FET 106 relative to the gate voltage of the power FET 104. The voltage-controlled voltage source 116 provides a voltage Vx that is a function of VOUT. In some examples, Vx decreases as VOUT increases, and eventually becomes 0V at a particular value of VOUT. A second input of the amplifier 114 is coupled to a similar voltage-controlled voltage source 118, which biases the voltage of the second input relative to VOUT.

The circuit 103 includes another transistor 110, which in this example is an n-type MOSFET that controls an output voltage of the amplifier 114. Specifically, a drain of the n-type MOSFET 110 is coupled to the source of the sense FET 106 and to the input of the amplifier 114 and a source of the n-type MOSFET 110 is coupled to the ground terminal. An output of the amplifier 114 is coupled to a gate of the n-type MOSFET 110 and is regulated based on the current (a "sense current") flowing through the n-type MOSFET 110. The output of the amplifier 114 regulates the gate of the n-type MOSFET 110 such that the voltage at the source of the sense FET 106 is very close to the voltage at the source of the power FET 104. The output of the amplifier 114 is also coupled to a gate of another transistor 112, which in this example is an n-type MOSFET that provides the sense current to additional circuitry to provide feedback (e.g., a feedback voltage) to regulate the gate voltage of the power FET 104, thus regulating the load current provided to the load 102. Specifically, a drain of the n-type MOSFET 112 is coupled to the additional circuitry (not shown in FIG. 1 for simplicity) and a source of the n-type MOSFET 112 is coupled to the ground terminal.

During operation, the gate-to-source voltages ($V_{GS}$) of the power FET 104 and the sense FET 106 are similar because the amplifier 114 operates to maintain this condition. Thus, the gate voltage of the sense FET 106 can be given by VOUT+$V_{GS}$+Vx, while the source voltage of the sense FET 106, and the voltage of the first input to the amplifier 114 (VSNS), can be given by VSNS=VOUT+$V_{GS}$+Vx−$V_{GS}$=VOUT+Vx. Similarly, the voltage of the second input to the amplifier is also given by VOUT+Vx. Thus, even when VOUT is equal to 0V, $V_{DS}$ of the n-type MOSFET 110 is equal to Vx, which is non-zero when VOUT is equal to 0V and for relatively small values of VOUT. Conversely, in the absence of the voltage-controlled voltage source 116, $V_{DS}$ of the n-type MOSFET 110 inhibits current flow when VOUT is equal to 0V, leading to an inability to accurately sense current and provide feedback to control the gate voltage of the power FET 104. Additionally, using similar voltage-controlled voltage sources 116, 118 avoid an error in the sensed current, which would result if there was a mismatch in the two voltage sources 116, 118. As a result of the n-type MOSFETs 110 and 112 being both source-coupled and gate-coupled, the sense current that flows through the n-type MOSFET 110 will also flow through the n-type MOSFET 112.

Figure 2:
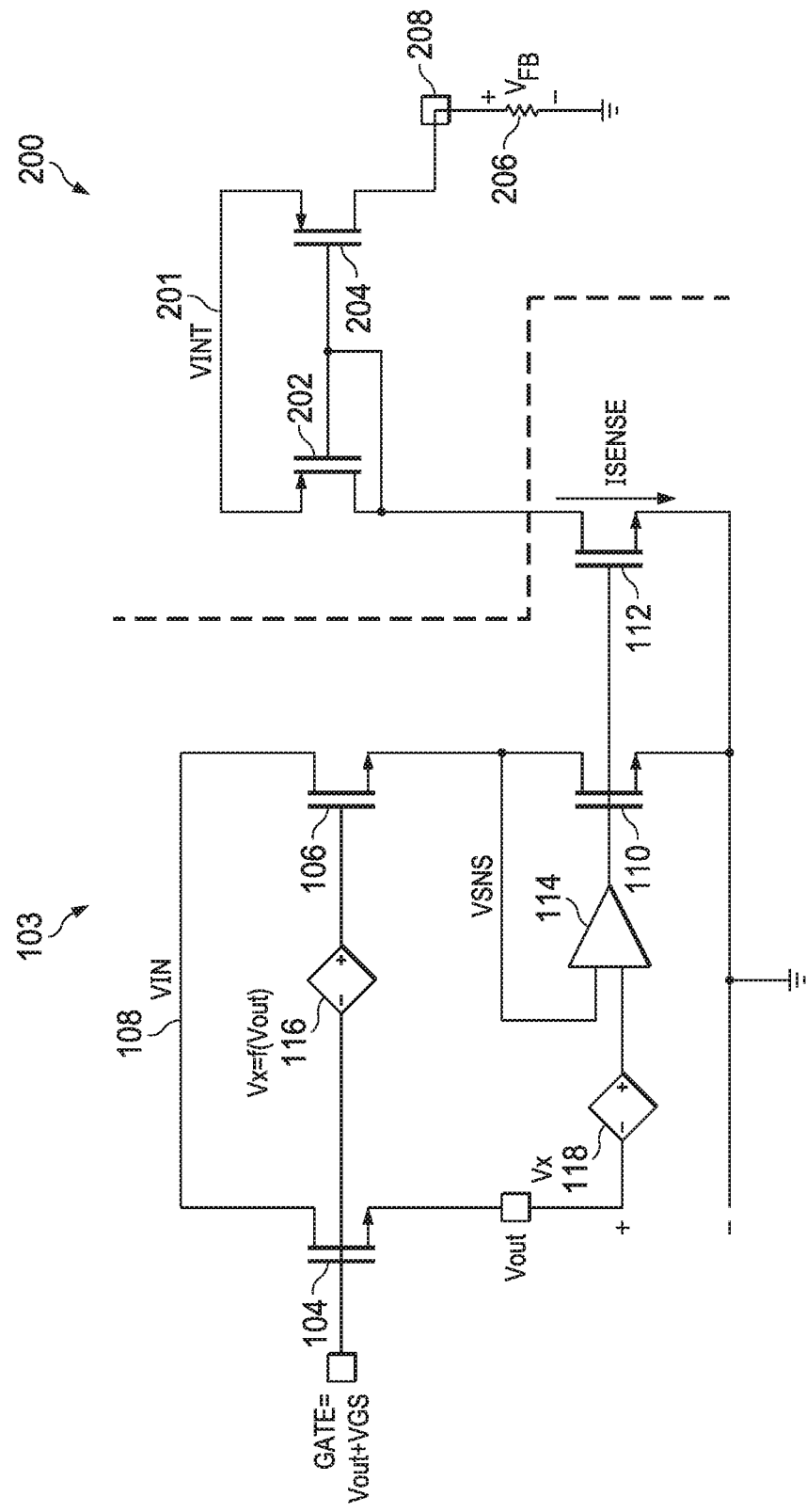
FIG. 2 shows the circuit schematic diagram of FIG. 1 in addition to a feedback circuit in accordance with an example.

FIG. 2 shows the power switch and current sense circuit 103 of FIG. 1 coupled to an example feedback circuit 200 that provides feedback (e.g., a feedback voltage $V_{FB}$) to regulate the gate voltage of the power FET 104, thus regulating the load current provided to the load. The feedback circuit 200 is coupled to the n-type MOSFET 112 through which the sense current flows, as explained above with respect to FIG. 1. In this example, the feedback circuit 200 includes a current mirror comprising p-type MOSFETs 202 and 204. The p-type MOSFET 202 includes a drain coupled to the n-type MOSFET 112, a gate-drain coupling, and a source coupled to an intermediate voltage source 201, which provides an intermediate voltage (VINT). The p-type MOSFET 202 includes a source also coupled to the intermediate voltage source 201, a gate coupled to the gate of the p-type MOSFET 202, and a drain coupled to a pin 208. A resistor 206 is coupled to the pin 208 (e.g., by an end-user of the power switch and current sense circuit 103 and the example feedback circuit 200) and to a ground node, and a voltage across the resistor 206 comprises the feedback voltage $V_{FB}$.

The sense current that flows through the n-type MOSFET 112 is mirrored by the current mirror comprising the p-type MOSFETs 202, 204. As a result, the sense current also flows through the resistor 206, resulting in the feedback voltage $V_{FB}$ across the resistor 206. The feedback voltage $V_{FB}$ is then used to regulate the gate of the power FET 104, in some examples using an intermediate amplifier (not shown for simplicity), to regulate the load current provided by the power FET 104. The resistance value of the resistor 206 is thus selected to achieve a desired load current limit. For example, if the resistor 206 has a resistance of 30 kΩ, the load current is limited or regulated to 0.6 A. On the other hand, if the resistor 206 has a resistance of 3 kΩ, the load current is limited or regulated to 6 A.

FIG. 3a shows a set of waveforms 300 that compare output voltage VOUT and load current IOUT as a function of time. The set of waveforms 300 corresponds to a power switch and current sense circuit that does not employ the voltage-controlled voltage sources shown in FIGS. 1 and 2. In particular, because of the poor ability to accurately sense load current for low values of VOUT, as described above, initially the gate voltage of the power FET 104 is not properly regulated, which causes a sharp initial increase in the load current. After VOUT reaches a sufficient level (e.g., such that $V_{DS}$ of the n-type MOSFET 110 no longer limits the sense current), the gate voltage of the power FET 104 begins to be regulated, limiting the load current to a particular limit value. Once the current is regulated to the limiting value, VOUT charges linearly because $$VOUT = \frac{1}{Cout}\int IOUT\, dt,$$

where Cout represents the load capacitance. After fully charging the load capacitance, VOUT levels off and IOUT drops from the limits value to just the current that is drawn by the load 102 (ILoad). The initial spike in IOUT, which results from an inability to accurately sense current for low values of VOUT, is undesirable as it may damage the input voltage VIN supply 108, the power FET 104, or both.

FIG. 3b shows another set of waveforms 350 that compare output voltage VOUT and load current IOUT as a function of time. The set of waveforms 350 corresponds to the examples shown in FIGS. 1 and 2 in which the power switch and current sense circuit uses the voltage-controlled voltage source 116 to bias the drain of the n-type MOSFET 110 even when VOUT is equal to 0V. As a result, a sense current is accurately generated through the n-type MOSFETs 110 and 112 even when VOUT is equal to 0V, which allows the gate voltage of the power FET 104 to be properly regulated, which in turn regulates the load current for all values of VOUT. For the same reasons as explained above, VOUT charges linearly and once VOUT is charged to approximately VIN, IOUT drops from the limit value to just the current that is drawn by the load 102 (ILoad). As a result of there being no initial spike in IOUT relative to the set of waveforms 300 of FIG. 3a, the input voltage VIN supply 108 and the power FET 104 are protected from damage that might occur if a tolerable current limit is exceeded.

Figure 4:
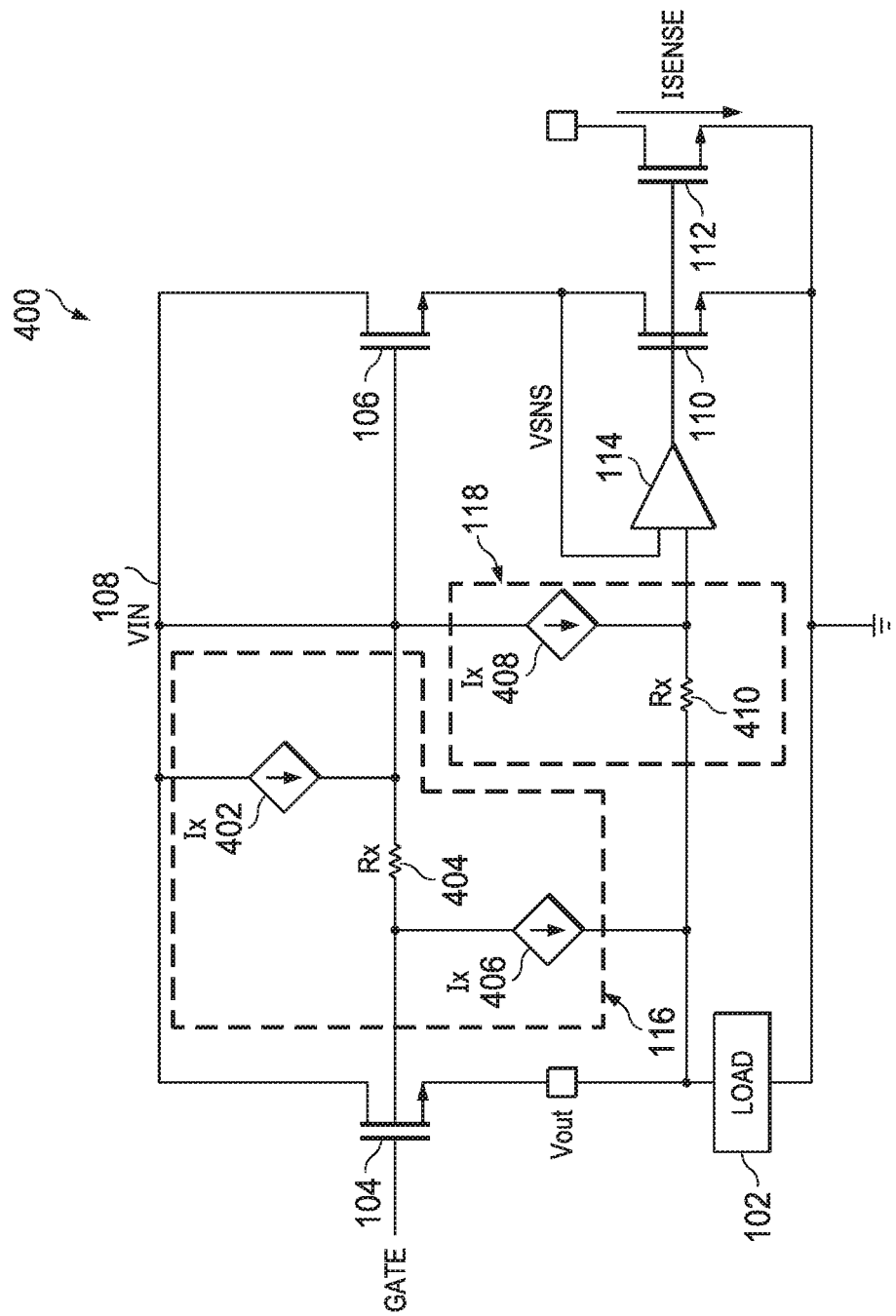
FIG. 4 shows an alternate implementation of the circuit schematic diagram of FIG. 1 in accordance with an example.

FIG. 4 shows a power switch and current sense circuit 400 similar to the circuit 103 in FIG. 1, except that the voltage-controlled voltage sources 116 and 118 are schematically represented by combinations of voltage-controlled current sources and resistors. For example, the voltage-controlled voltage source 116 is replaced by voltage-controlled current sources 402, 406 and a resistor 404. The voltage-controlled current source 402 generates a current Ix that is a function of VOUT. The voltage-controlled current source 406 is designed to generates an identical current Ix, so that the current Ix also flows through the resistor 404 to ground, which generates a voltage across the resistor 404 (Vx) that is proportional to the current Ix. Similarly, the voltage-controlled voltage source 118 is replaced by a voltage-controlled current source 408 and a resistor 410. The voltage-controlled current source 408 also generates a current Ix that is a function of VOUT. The current Ix flows through the resistor 410 to the load, since the input to the amplifier 114 is high impedance, which generates a voltage across the resistor 410 (Vx) that is proportional to the current Ix. As above, even when VOUT is equal to 0V, $V_{DS}$ of the n-type MOSFET 110 is equal to Vx, which is non-zero when VOUT is equal to 0V and for relatively small values of VOUT.

FIG. 5a shows a waveform 500 comprising a constant current with respect to VOUT (Ic) and a current proportional to the output voltage VOUT, with a constant of proportionality 1/R (VOUT/R) as functions of VOUT.

FIG. 5b shows a waveform 510 that shows an example of the voltage-controlled current Ix, explained above, as a function of VOUT. The current Ix is obtained by subtracting VOUT/R from Ic, both of which are shown in the waveform 500 of FIG. 5a. In an example, Ix=Ic−VOUT/R.

FIG. 5c shows a waveform 520 that shows an example of the voltage-controlled voltage Vx, explained above, as a function of VOUT. Essentially, the waveform 520 converts the current Ix shown in the waveform 510 of FIG. 5b to a voltage by dividing by a resistance Rx, or Vx=Ix/Rx.

The constant current Ic is chosen based on the Vx that is desired and the resistor Rx that is chosen for the particular implementation. For example, when VOUT is equal to 0V, then VOUT/R current of waveform 500 is also 0, and thus Ix=Ic−VOUT/R=Ic. Correspondingly, when VOUT is equal to 0V, then Vx=Ic*Rx. As a result of Vx being the $V_{DS}$ of the transistor 110, then Vx is determined based on the biasing requirement of the transistor 110, and Ic and/or Rx may be chosen to satisfy this requirement. In some examples, Rx is selected to be relatively small, which benefits the speed of the current sense circuit, however at the cost of increased power consumption due to a corresponding increase in Ic. The value of R from VOUT/R, discussed in further detail below with respect to FIG. 6, is selected based on the VOUT voltage at which Vx should be 0V (e.g., the VOUT at which the voltage-controlled voltage sources 116, 118 are removed from operation).

Figure 6:
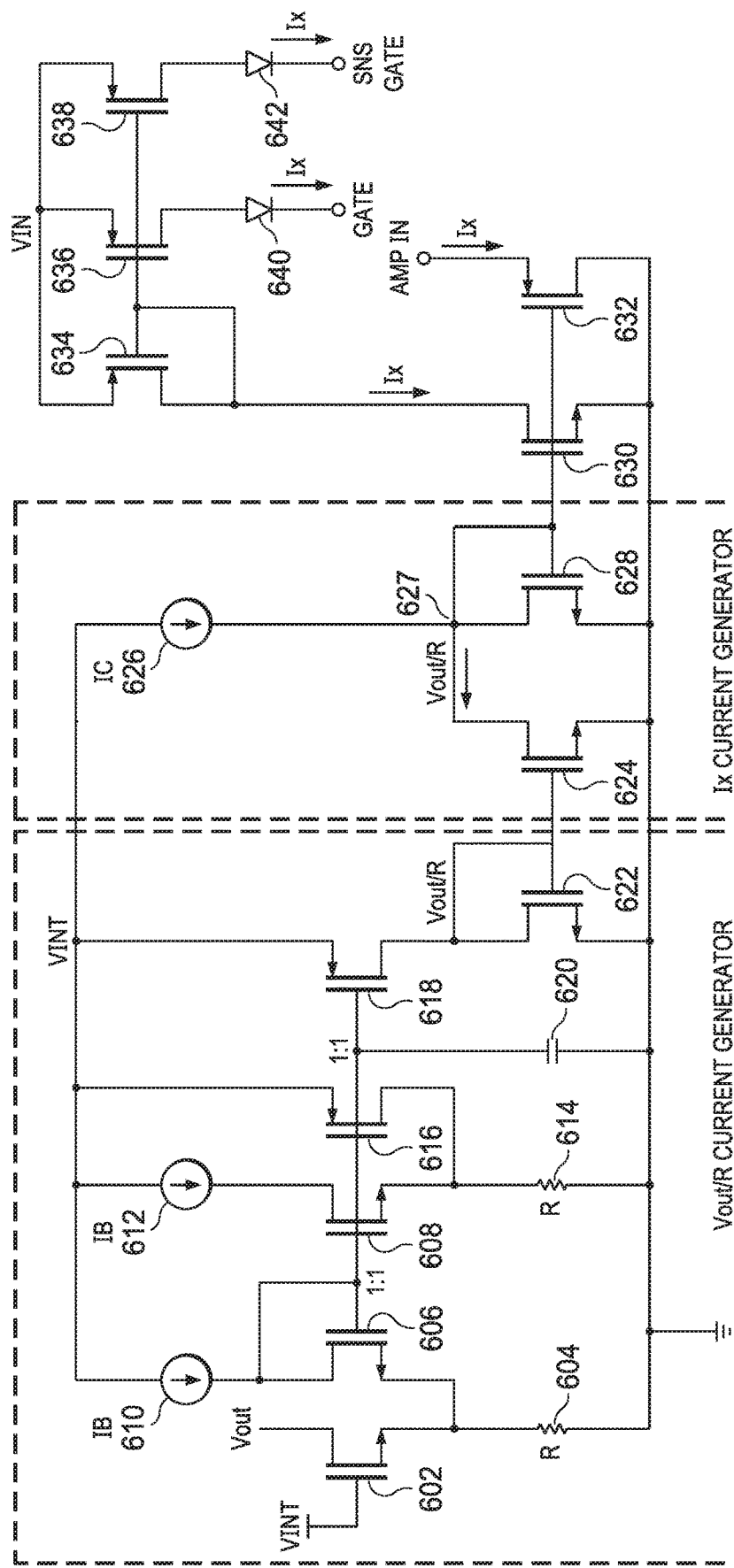
FIG. 6 shows an example implementation of voltage-controlled current sources of FIG. 4 in accordance with an example.

FIG. 6 shows an example circuit 600 to convert VOUT to Ix, for example to be used as a voltage-controlled voltage source as explained above in FIG. 4 (e.g., using the resistors 404, 410 having resistance Rx). A first portion 601 of the example circuit 600 generates the current VOUT/R described above. In particular, the output voltage VOUT is applied to a drain of an n-type MOSFET 602, which in some examples comprises a laterally diffused MOSFET (LDMOS) 602. A gate of the n-type MOSFET 602 is coupled to an intermediate voltage source (VINT) so that the n-type MOSFET 602 is conducting. Thus, when VOUT is equal to 0V, the source of the n-type MOSFET 602 is also at 0V. Similarly, when VOUT is greater than 0V, the source of the n-type MOSFET 602 is also at the same value, which induces a current of VOUT/R through the resistor 604. The source of the n-type MOSFET 602 follows VOUT while VOUT is less than VINT minus the overdrive voltage ($V_{OV}$) of the n-type MOSFET 602. After VOUT increases above VINT−$V_{OV}$ of the n-type MOSFET 602, the source of the n-type MOSFET 602 is clamped to VINT−$V_{OV}$ and VOUT sensing ceases, which is tolerable since examples of this disclosure only relate to sensing values of VOUT relatively close to 0V.

The source of the n-type MOSFET 602 is coupled to a source of another n-type MOSFET 606. The n-type MOSFET 606 includes a gate-drain coupling and is gate-coupled to an n-type MOSFET 608, which together form a current mirror. The drains of the n-type MOSFETs 606, 608 are coupled to the internal voltage source VINT. Matched bias current sources 610, 612 supply a current IB to the drains of the two matched n-type MOSFETs 606, 608, and thus the source of the n-type MOSFET 608 will also be at VOUT. With VOUT effectively copied to the source of the n-type MOSFET 608, a current of VOUT/R is also induced through the resistor 614. Thus, the total current through the resistors 604 and 614 is VOUT/R+IB.

The source of the n-type MOSFET 608 is coupled to a drain of a p-type MOSFET 616. The p-type MOSFET 616 includes a gate-source coupling and is gate-coupled to another p-type MOSFET 618, which together forms a current mirror. The sources of the p-type MOSFETs 616, 618 are also coupled to the intermediate voltage source VINT. As a result of the current flowing through the resistor 614 being equal to IB plus the voltage-induced current VOUT/R, and the current flowing through the n-type MOSFET 608 being equal to IB, the voltage-induced current VOUT/R is sourced from the p-type MOSFET 616, which is thus mirrored by the p-type MOSFET 618. The current VOUT/R flows from the drain of the p-type MOSFET 618.

The drain of the p-type MOSFET 618 is coupled to a drain of another n-type MOSFET 622. The n-type MOSFET 622 includes a gate-drain coupling and is gate-coupled to yet another n-type MOSFET 624, which together form a current mirror. The sources of the n-type MOSFETs 622, 624 are coupled to a ground node. As a result of the current VOUT/R flowing from the p-type MOSFET 618 and through the n-type MOSFET 622, this current is mirrored to the n-type MOSFET 624, concluding the first portion 601 that generates the current VOUT/R.

A second portion 623 of the example circuit 600, which is shown schematically as beginning with the n-type MOSFET 624, generates the current Ix described above. In particular, the current VOUT/R flows through the n-type MOSFET 624 as explained. The second portion 623 includes a current source 626 that generates the current Ic described above. The current source 626 is coupled to a drain of an n-type MOSFET 628 in addition to a drain of the n-type MOSFET 624 through which the current VOUT/R flows. The n-type MOSFET 628 includes a gate-drain coupling and is gate-coupled to another n-type MOSFET 630, which together form a current mirror. The sources of the n-type MOSFETs 628, 630 are coupled to a ground node. As a result of the current Ic flowing into a node 627, and the current VOUT/R flows out of the node 627 through the n-type MOSFET 624, the current that flows through the n-type MOSFET 628 is equal to Ic−VOUT/R or Ix. This current Ix is mirrored to the n-type MOSFET 630, concluding the second portion 623 that generates the current Ix.

The n-type MOSFET 630 through which the current Ix flows is gate-coupled and source-coupled to an n-type MOSFET 632, which thus also mirrors the current Ix. A drain of the n-type MOSFET 632 is coupled to an amplifier input node (e.g., input to the amplifier 114), and thus this leg represents the voltage-controlled current source 408 described above with respect to FIG. 4.

The drain of the n-type MOSFET 632 is coupled to a drain of a p-type MOSFET 634. The p-type MOSFET 634 includes a gate-drain coupling and is gate-coupled to p-type MOSFETs 636, 638, which together form a current mirror. Sources of the p-type MOSFETs 634, 636, 638 are coupled to the input voltage source VIN. As a result of the current Ix flowing through the n-type MOSFET 630, the current Ix also flows through the p-type MOSFETs 634, 636, 638. A drain of the p-type MOSFET 636 is coupled to the gate of the power FET 104 via a blocking diode 640, and thus this leg represents the voltage-controlled current source 406 described above with respect to FIG. 4. A drain of the p-type MOSFET 638 is coupled to the gate of the sense FET 106 via a blocking diode 642, and thus this leg represents the voltage-controlled current source 402 described above with respect to FIG. 4. In steady-state operation when VIN=VOUT, the GATE and SNS GATE voltages are greater than VOUT (e.g., by approximately 5V) since the power FET 104 is fully on, and thus the blocking diodes 640, 642 prevent current from flowing to VIN through body diodes of the p-type MOSFETs 636, 638, which would be undesirable.

The circuit 600 of FIG. 6 is one example of how the voltage-controlled voltage sources 116, 118 of FIG. 1—and their equivalent implementation in FIG. 4 using voltage-controlled current sources 402, 406, 408 and resistors 404, 410—may be designed. However, it should be appreciated that the scope of this disclosure is not limited to the specific example of FIG. 6, and is meant to generally cover examples that utilize a voltage-controlled voltage source (or equivalents) to bias a transistor implicated in current sensing operations such that even when VOUT is equal to 0V, a $V_{DS}$ of the transistor is not too low for that device to operate in saturation mode. As a result, accurate current sensing is possible even for low values of VOUT, including when VOUT is equal to 0V.

The foregoing examples address issues related to accurate current sensing for low values of VOUT, including when is equal to 0V. In the foregoing discussion and in the claims, reference is made to various circuit elements and circuitry, which correspond to hardware circuitry, for example implemented on an integrated circuit (IC). In at least one example, the current sensing circuit is implemented on an IC.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means +/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
   a power transistor having a drain and a source coupled between an input voltage source and an output voltage node, and having a first gate;
   an amplifier having a first input, a second input, and an output;
   a sense transistor having a drain and source coupled between the input voltage source and the first input of the amplifier and having a second gate;
   a third transistor having a drain and source coupled between the sense transistor and a ground node and having a control terminal coupled to the output of the amplifier;
   a first voltage-controlled voltage source coupled between the first and second gates; and
   a second voltage-controlled voltage source coupled between the output voltage node and the second input of the amplifier.

2. The device of claim 1 in which the first voltage-controlled voltage source includes:
   a first resistor coupled between the first and second gates;
   a first voltage-controlled current source coupled to the input voltage source and to a first side of the first resistor; and
   a second voltage-controlled current source coupled to a second side of the first resistor and to the output voltage node.

3. The device of claim 2 in which the first and second voltage-controlled current sources are configured to:
   generate a non-zero current in response to a voltage at the output voltage node being zero Volts (0V); and
   generate no current in response to the voltage at the output voltage node reaching a value greater than 0V.

4. The device of claim 3 in which the first and second voltage-controlled current sources are further configured to generate a linearly-decreasing current in response to the voltage at the output voltage node varying from 0V to the value greater than 0V.

5. The device of claim 1 in which the second voltage-controlled voltage source includes:
   a second resistor coupled between the second input of the amplifier and the output voltage node; and
   a third voltage-controlled current source coupled between the input voltage source and a node between the second resistor and the second input of the amplifier.

6. The device of claim 5 in which the third voltage-controlled current source is configured to:
   generate a non-zero current in response to a voltage at the output voltage node being zero Volts (0V); and
   generate no current in response to the voltage at the output voltage node reaching a value greater than 0V.

7. The device of claim 6 in which the third voltage-controlled current source is further configured to generate a linearly-decreasing current in response to the voltage at the output voltage node varying from 0V to the value greater than 0V.

8. A device, comprising:
   a power transistor having a drain and source coupled between an input voltage source and an output voltage node, having a gate, and configured to provide a load current to a load coupled to the output voltage node;
   a sense transistor having a drain and source coupled between the input voltage source and a ground node, having a gate coupled to the gate of the power transistor, and configured to generate a sense current proportional to the load current;
   a third transistor having a drain and source coupled between the sense transistor and the ground node and having a control terminal;
   an amplifier having a first input coupled to a node between the sense and third transistors, having a second input, and having an output coupled to the control terminal of the third transistor;
   a first voltage-controlled voltage source coupled between the gates of the power transistor and the sense transistor and configured to bias the gate of the sense transistor relative to the gate of the power transistor; and
   a second voltage-controlled voltage source coupled between the input voltage source and the amplifier second input, and configured to bias the second input of the amplifier relative to the output voltage node, the first and second voltage-controlled voltage sources being configured to be controlled in response to a voltage at the output voltage node.

9. The device of claim 8 in which the first and second voltage-controlled voltage sources are configured to:
   generate a non-zero voltage in response to the voltage at the output voltage node being zero Volts (0V); and
   generate no voltage in response to the voltage at the output voltage node reaching a value greater than 0V.

10. The device of claim 9 in which the first and second voltage-controlled voltage sources are further configured to generate a linearly-decreasing voltage in response to the voltage at the output voltage node varying from 0V to the value greater than 0V.

11. The device of claim 9 in which:
   a voltage at the node between the sense and third transistors is non-zero as a result of the first voltage-controlled voltage source being configured to generate the non-zero voltage in response to the voltage at the output voltage node being 0V; and
   the voltage at the node between the sense and third transistors is equal to the voltage at the output voltage node as a result of the first voltage-controlled voltage source being configured to generate no voltage in response to the voltage at the output voltage node reaching the value.

12. The device of claim 8 in which the power transistor is configured to regulate the load current based on feedback derived from the sense current.

13. A system, comprising:
   a load coupled to an output voltage node and to a ground node and configured to draw a load current; and
   a power switch and current sense circuit configured to supply the load current and to couple the output voltage node to an input voltage source, the circuit including:
   a power transistor having a drain and source coupled between the input voltage source and the output voltage node, and having a gate;
   an amplifier having a first input, a second input, and an output;
   a sense transistor having a drain and source coupled between the input voltage source and the first input of the amplifier and having a gate;
   a third transistor having a drain and source coupled between the sense transistor and the ground node, and having a control terminal coupled to the output of the amplifier;
   a first voltage-controlled voltage source coupled between the gate of the first power transistor and the gate of the sense transistor; and a second voltage-controlled voltage source coupled between the output voltage node and the second input of the amplifier.

14. The system of claim 13 in which the first voltage-controlled voltage source includes:
a first resistor coupled between the gate of the power transistor and the gate of the sense transistor;
a first voltage-controlled current source coupled between the input voltage source and a first side of the first resistor; and
a second voltage-controlled current source coupled to a second side of the first resistor and to the output voltage node.

15. The system of claim 14 in which the first and second voltage-controlled current sources are configured to:
generate a non-zero current in response to a voltage at the output voltage node being zero Volts (0V); and
generate no current in response to the voltage at the output voltage node reaching a value greater than 0V.

16. The system of claim 15 in which the first and second voltage-controlled current sources are further configured to generate a linearly-decreasing current in response to the voltage at the output voltage node varying from 0V to the value greater than 0V.

17. The system of claim 13 in which the second voltage-controlled voltage source includes:
a second resistor coupled to the second input of the amplifier and to the output voltage node; and
a third voltage-controlled current source coupled between the input voltage source and the second input of the amplifier.

18. The system of claim 17 in which the third voltage-controlled current source is configured to:
generate a non-zero current in response to a voltage at the output voltage node being zero Volts (0V); and
generate no current in response to the voltage at the output voltage node reaching a value greater than 0V.

19. The system of claim 18 in which the third voltage-controlled current source is further configured to generate a linearly-decreasing current in response to the voltage at the output voltage node varying from 0V to the value greater than 0V.

20. A circuit comprising:
a first transistor having first and second transistor terminals and a first gate;
a second transistor having third and fourth transistor terminals and second gate, the first and third transistor terminals coupled together;
a third transistor having a fifth transistor terminal and a control terminal, the fourth and fifth transistor terminals coupled together;
an amplifier having first and second amplifier inputs and an amplifier output, the first amplifier input coupled to the fourth and fifth transistor terminals, and the amplifier output coupled to the control terminal;
a first voltage-controlled voltage source coupled between the first and second gates; and
a second voltage-controlled voltage source coupled between the second transistor terminal and the second amplifier input.

21. A sense circuit comprising:
a sense field-effect transistor (FET) having first and second transistor terminals and a first gate, the first transistor terminal coupled to an input voltage terminal;
a second FET having third and fourth transistor terminals and a second gate, the second and third transistor terminals coupled together, and the fourth transistor terminal coupled to a ground terminal;
an amplifier having first and second amplifier inputs and an amplifier output, the first amplifier input coupled to the second and third transistor terminals, the amplifier output coupled to the second gate, the amplifier configured to control a voltage at the second gate to generate a sense current through the second transistor representative of a current through a third transistor;
a first voltage-controlled voltage source coupled to the first gate and configured to bias the first gate relative to a gate voltage at a gate of the third transistor; and
a second voltage-controlled current source coupled to the second amplifier input and configured to bias the second amplifier input relative to an output voltage at a transistor terminal of the third transistor.

* * * * *